United States Patent [19]
Jolly

[11] Patent Number: 4,488,348
[45] Date of Patent: Dec. 18, 1984

[54] METHOD FOR MAKING A SELF-ALIGNED VERTICALLY STACKED GATE MOS DEVICE

[75] Inventor: Richard D. Jolly, Aloha, Oreg.

[73] Assignee: Hewlett-Packard Company, Palo Alto, Calif.

[21] Appl. No.: 504,632

[22] Filed: Jun. 15, 1983

[51] Int. Cl.$^3$ .................. H01L 21/90; H01L 23/52
[52] U.S. Cl. .................................. 29/571; 148/1.5;
29/576 B; 29/578; 29/580
[58] Field of Search .............. 29/571, 576 B; 148/1.5

[56] References Cited

U.S. PATENT DOCUMENTS

| 4,402,761 | 9/1983 | Feist | 29/571 |
|---|---|---|---|
| 4,407,060 | 10/1983 | Sakurai | 29/571 |
| 4,408,385 | 10/1983 | Rao et al. | 29/571 |
| 4,409,722 | 10/1983 | Dockerty et al. | 29/571 |
| 4,413,403 | 11/1983 | Ariizumi | 29/571 |
| 4,420,871 | 12/1983 | Scheibe | 29/571 |
| 4,432,133 | 2/1984 | Furuya | 29/571 |

FOREIGN PATENT DOCUMENTS 091775  10/1983  European Pat. Off. .............. 29/571

OTHER PUBLICATIONS

J. F. Gibbons et al., IEEE, EDL, 1, No. 6, pp. 117–118, Jun. 1980.
J. P. Colinge et al., IEDM 81, pp. 557–560, 1981.
G. F. Goeloc et al., IEDM 81, pp. 554–556, 1981.

Primary Examiner—Veronica O'Keefe
Attorney, Agent, or Firm—Jeffery B. Fromm; Cheryl L. Shavers

[57] ABSTRACT

A method and structure for producing a vertically built MOS structure which permits the out diffusion of dopant from a layer of chemically deposited (CVD) doped oxide into a layer of CVD laser recrystallized polysilicon is disclosed. This out diffusion is accomplished during a high temperature oxidation treatment of an intermediate structure. Source and drain mask alignment is chosen such that this out diffusion of dopant from the CVD glass at its boundary limit will meet with a diffusion of implanted ions. This process makes possible minimal overlap of the drain and source zones with the gate, thus reducing coupling capacitance while providing increased packing density.

5 Claims, 20 Drawing Figures

METHOD FOR MAKING A SELF-ALIGNED VERTICALLY STACKED GATE MOS DEVICE

BACKGROUND OF THE INVENTION

Fabricating integrated circuits with less coupling capacitance and higher density is a major goal in the manufacturing of very large scale integrated (VLSI) circuits. As device geometries are reduced to the micrometer and submicrometer range, further developments in silicon gate metal-oxide semiconductor (MOS) processing methods are needed.

In the prior art, CMOS structures having a common gate for both n and p channel devices have been fabricated using bulk silicon for the p channel device (lower transistor) and a laser recrystallized silicon film for the n channel device (upper transistor), (see e.g., J. F. Gibbons and K. F. Lee, "One-Gate Wide CMOS Inverter on Laser-Recrystallized Polysilicon", IEEE Electron Device Letters, Vol. EDL-1, No. 6, June, 1980). The Gibbons and Lee structure is vertically built and obtains high packing density by means of a self aligned common gate structure. However, the CMOS process used to produce this common gate device results in a complete source and drain overlap of the gate for the upper transistor. This overlap contributes to large coupling capacitance, which is undesirable for high performance MOS devices. Reduction of the coupling capacitance results in high circuit speed and low power drain in the device. Thus, it is important to obtain a MOS process which minimizes coupling capacitance and obtains high packing density. In addition, it is desirable that such a process be compatible with standard VLSI processing.

SUMMARY OF THE INVENTION

The present invention solves the problems of the prior art by preventing source and drain overlap of the gate for the upper transistor. The invention includes new MOS processing sequences for producing a vertically built MOS structure in either CMOS or NMOS technologies which permits the out diffusion of dopant from a layer of chemically vapor deposited (CVD) doped oxide (for example phosphosilicate glass) into a layer of CVD laser recrystallized polysilicon. This outdiffusion is usually accomplished by subjecting an intermediate structure to a high temperature oxidation treatment. Subsequent source and drain mask alignment is chosen such that this out diffusion of dopant from the CVD glass at its boundary limit will meet with a diffusion of implanted source and drain ions.

A layer of thermally grown stress relief silicon dioxide (SRO) and a low pressure chemically vapor deposited (LPCVD) silicon nitride layer are used above a selected area of laser recrystallized polysilicon as a mask against subsequent oxidation. During this oxidation which is done at high temperature, the dopant out diffuses from the doped oxide thereby doping the adjacent laser recrystallized polysilicon region. The source and drain zones are then defined by anisotropic etching of the SRO and silicon nitride. The mask alignment is selected to cover the boundary limits of dopant into the laser recrystallized polysilicon. In addition to these out diffused regions, additional diffusion of the source and drain implants occur during high temperature anneal and drive-in.

The mask alignment adjustment in this sequence makes possible minimal overlap of the drain and source zones with the gate, thus reducing coupling capacitance while providing increased packing density due to the vertically built structure. In addition, this process sequence requires only conventional VLSI fabrication techniques.

DETAILED DESCRIPTION OF THE INVENTION

Figure 1A:
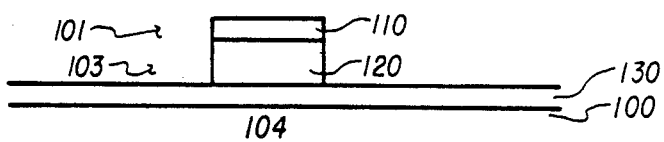
FIGS. 1A–1N illustrate a first embodiment of a self-aligned vertically built common gate MOS structure and method according to the present invention.
Figure 1B:
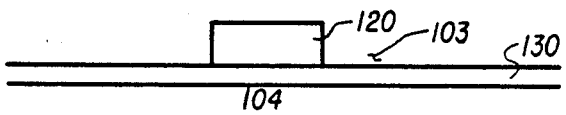
Figure 1C:
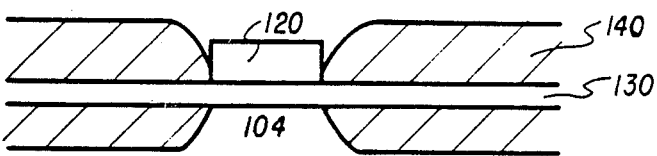
Figure 1D:
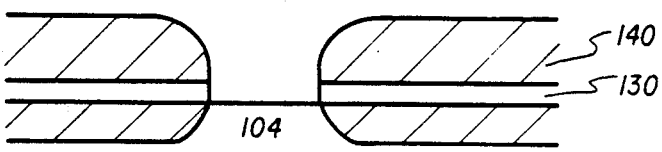
Figure 1E:
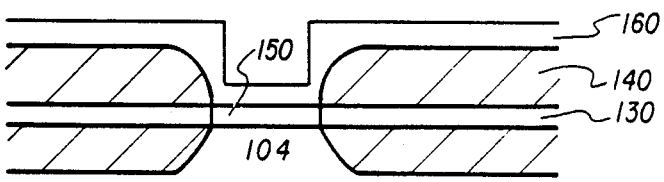
Figure 1F:
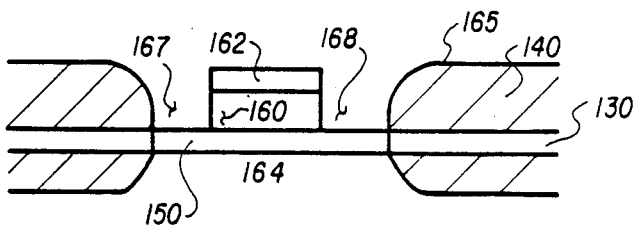
Figure 1G:
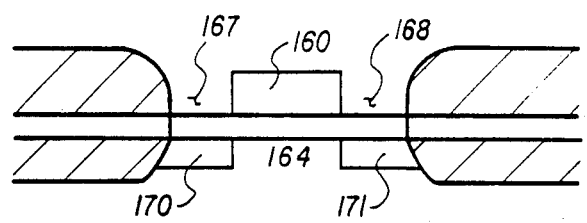
Figure 1H:
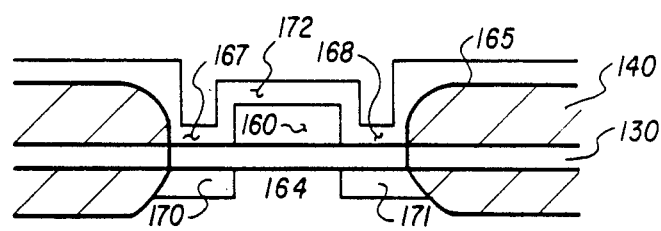
Figure 1I:
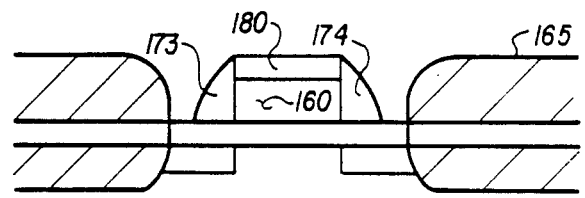
Figure 1J:
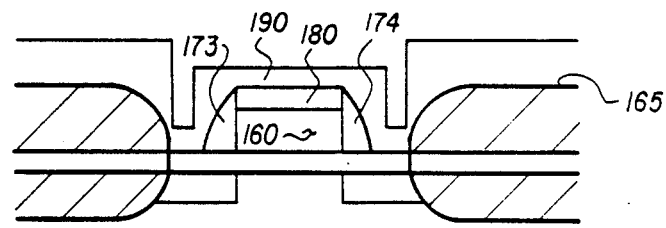
Figure 1K:
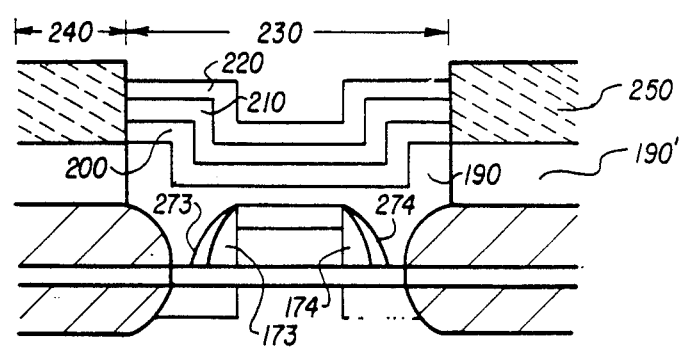
Figure 1L:
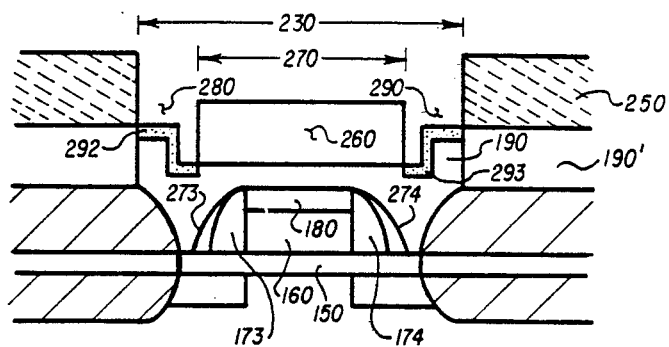
Figure 1M:
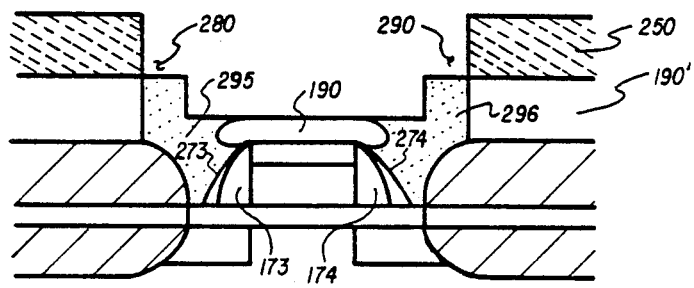
Figure 1N:
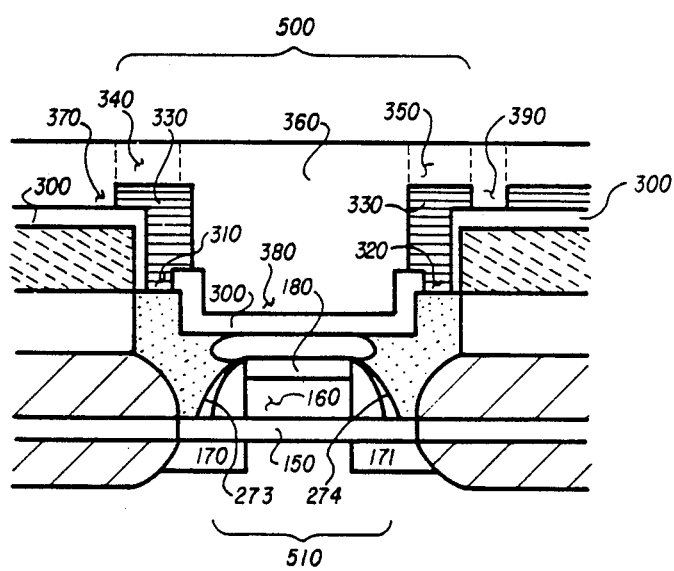

FIGS. 1A–1N illustrate a first embodiment of the present invention. In FIG. 1A on a silicon substrate 100 typically doped with n− dopant, a stress relief oxide (SRO) layer 130 is formed, typically consisting of thermally grown silicon dioxide (SRO). A first masking layer 120, e.g., a low pressure chemically vapor deposited (LPCVD) silicon nitride film is formed over the first SRO layer 130. A photoresist layer 110 on top of the first nitride layer 120 is utilized so that the first nitride layer 120 can be removed over a region 101 of substrate 100 by etching for example by a flurocarbon plasma. A trench 103 is formed by complete removal of nitride layer 120 in region 101. First nitride 120, first SRO 130, and photoresist 110 layers form a mesa 104 above the trench 103 with no overhang. A channel stop (e.g., n+ dopant) can then be implanted in trench 103 if desired.

In FIG. 1B mesa 104 is shown overlain by the first nitride 120 and first SRO 130 layers after the photoresist mask 110 is removed in preparation for further masking. First SRO layer 130 remains in trench 103.

FIG. 1C shows growth of a first field oxidation (FOX) layer 140, over the first SRO layer 130, located in trench 103. It should be noted that in practice the first SRO 130 and first FOX 140 layers, although shown as separate entities for clarity, do not remain separate but merge together since they are chemically of the same material.

In FIG. 1D the first nitride 120 and first SRO 130 over mesa region 104 are removed to expose substrate 100.

A first gate oxidation (GOX) layer 150, as shown in FIG. 1E, is thermally grown over the exposed surface of substrate 100. If desired, a gate threshold control implant can then be applied in first GOX layer 150. Then a first polysilicon (POLY) layer 160 is deposited over the entire surface of the substrate 100 covering the first SRO layer 130, the first FOX layer 140, and the first GOX layer 150. The first POLY layer 160 is formed typically by low pressure chemically vapor deposited (LPCVD) techniques. The entire first POLY layer 160 is subsequently doped for example p+ with boron.

A positive photoresist layer 162 is then used to define regions 164 as shown in FIG. 1F and the first POLY layer 160 is removed over the rest of the surface 165 by etching. Thus trenches 167 and 168 are defined. Source 170 and drain 171 ion implants (e.g., with p+ material) followed by a high temperature drive-in are then done in trenches 167 and 168 respectively as shown in FIG. 1G. This implanting sequence also dopes the POLY layer 160.

After photomask 162 is removed a first doped glass layer 172 (e.g., silicon dioxide doped with n+ phosphorous) is deposited as shown in FIG. 1H over the entire surface 165 and first POLY layer 160.

The doped glass layer 172 is subsequently anisotropically etched using a directional plasma as shown in FIG. 1I. After the anisotropic etching, two small regions 173 and 174 of doped glass will remain adjacent to the first POLY region 160. A second gate oxidation (GOX) layer 180 is then thermally grown over the entire surface 165 and the POLY region 160 and etched leaving the second GOX layer 180 above the first POLY region 160.

A second polysilicon (POLY) layer 190 as shown in FIG. 1J is deposited over the entire surface 165, the small regions 173 and 174, and the second GOX 180. The second POLY layer 190 is formed typically by LPCVD techniques and is subsequently doped for example with p— material. The second POLY layer 190 is then recrystallized, for example by use of a laser.

As illustrated in FIG. 1K a second SRO layer 200 is grown over laser recrystallized POLY layer 190. Then a second masking layer 210, e.g., LPCVD silicon nitride, is deposited over second SRO layer 200 and a positive photoresist layer 220 is used over layer 210 to define an active region 230. The second nitride layer 210 and second SRO layer 200 are then removed over a region 240 to expose laser recrystallized POLY layer 190. After photoresist layer 220 is removed over region 230 a second field oxidation (FOX) layer 250 is then grown in region 240 over the exposed surface of laser recrystallized POLY layer 190. During the growth of second FOX layer 250 dopant from regions 173 and 174 diffuse to selected boundary limits 273 and 274, respectively, in laser recrystallized POLY layer 190. In addition, the portion of laser recrystallized POLY layer 190 in region 240 oxidizes to form oxidized POLY layer 190'.

In FIG. 1L the second nitride layer 210 and second SRO layer 200 over region 230 are removed to expose laser recrystallized POLY layer 190. A positive photoresist layer 260 in region 270 over the exposed surface of laser recrystallized POLY layer 190 is used as a mask to form trenches 280 and 290. Trenches 280 and 290 can now be implanted with a conductive material (e.g., n+ material) to form doped POLY layers 292 and 293. The alignment of positive photoresist layer 260 over laser recrystallized POLY layer 190 in region 270 is important and must be chosen such that during subsequent processing sequences the outdiffusion of both the dopant from regions 173 and 174 as well as the implanted ions from regions 292 and 293 will merge.

The conductive material in trenches 280 and 290 can now be redistributed in the laser recrystallized POLY layer 190 by means of heating after removal of positive photoresist layer 260 to form upper source and drain regions 295 and 296 as shown in FIG. 1M. During heating, redistributed conductive material in regions 280 and 290 will meet with dopant from regions 173 and 174 respectively, if positive photoresist layer 260 has been properly aligned. Also, part of POLY layer 190 will remain unaffected by the doping from regions 295 and 296 during this heating as shown.

Figure 2:
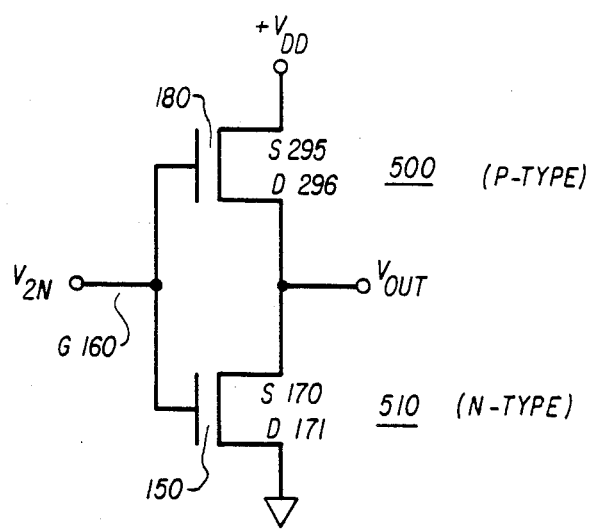
FIG. 2 is a schematic diagram of the embodiment illustrated in FIG. 1.

The structure is then completed as shown in FIG. 1N by depositing a first CVD oxide layer 300 over the entire surface of the structure, etching to form trenches 310 and 320 in the first CVD oxide layer 300, depositing a metal layer 330 over the entire surface of the structure, thereby filling in regions 310 and 320, and selectively etching metal layer 330 to form regions 340 and 350. Final passivation layer 360 is formed over the entire surface of the structure by CVD techniques. Passivation layer 360 can then be selectively etched leaving regions 370, 380 and 390. Contact to the underlying structure can be made through regions 310 and 320. This fabricating method can be used to produce a structure having source and drain regions 295 and 296 of an upper transistor 500 being of n type material and source and drain regions 170 and 171 of a lower transistor 510 being of p type material with p+ doped region 160 serving as a common gate contact between oxide regions 180 and 150 which can be used as a complimentary MOS inverter device schematically shown in FIG. 2.

Figure 3:
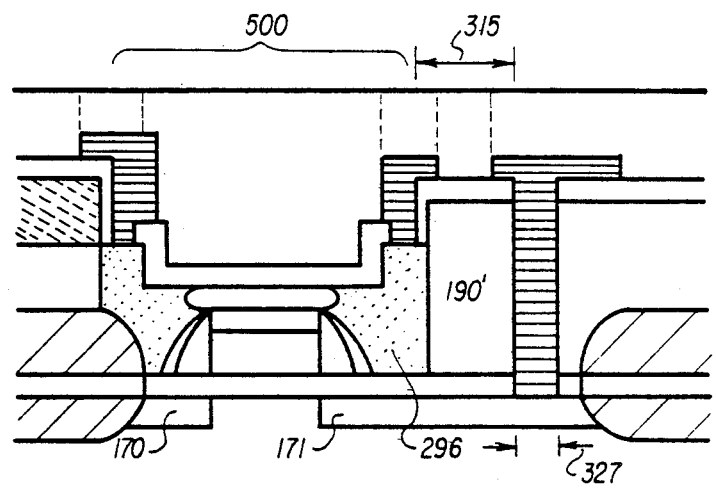
FIG. 3 illustrates an alternate structure using the method in FIG. 1.

FIG. 3 illustrates another structure using the method in FIGS. 1A–1N and shows how contact is made to the lower source and drain regions 170 and 171. This is accomplished by modification of the mask used in FIG. 1A so that the region 171 extends beyond the region 296 and across oxidized POLY layer 190'. Oxidized POLY layer 190' in region 315 provides isolation for contact 325 in region 327.

Figure 4:
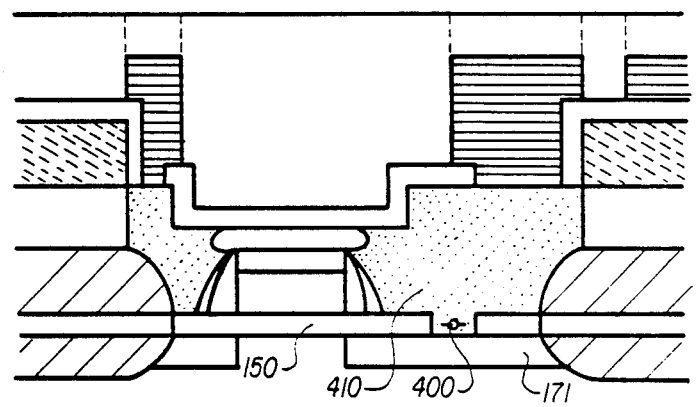
FIG. 4 illustrates a second embodiment of a self-aligned vertically built common gate MOS structure and method according to the present invention.

FIG. 4 shows a second embodiment of the present invention. the initial steps in FIG. 4 are similar to steps A through N in FIG. 1. However in this second embodiment the first GOX layer 150 is etched over selected region 400 leaving a surface portion of the underlying silicon substrate expose. Subsequent deposition and doping for example with n+ material of a POLY layer 410 fills in this region 400. This constitutes a buried contact to region 171.

Figure 5:
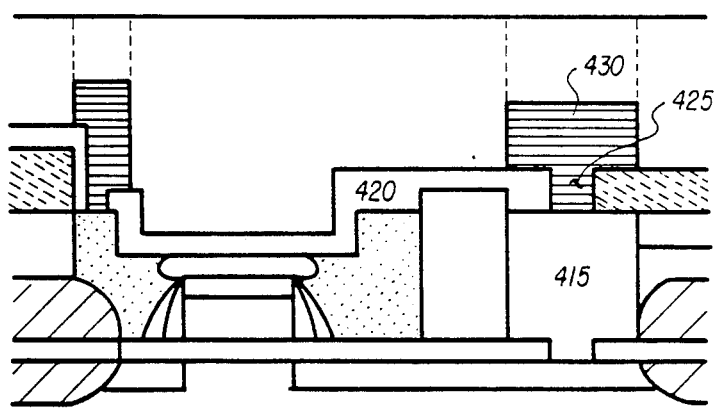
FIG. 5 illustrates a third embodiment of a self-aligned common gate MOS structure and method according to the present invention.

FIG. 5 illustrates a third embodiment of the present invention. The initial steps in FIG. 5 are similar to the processes of FIGS. 3 and 4. Additionally, a layer of CVD oxide 420 is deposited over a doped POLY layer 415. An opening 425 is etched through the CVD oxide layer 420 exposing the surface of doped POLY layer 415 and a metal layer 430 is then deposited thereby filling the previously etched opening 425.

Figure 7:
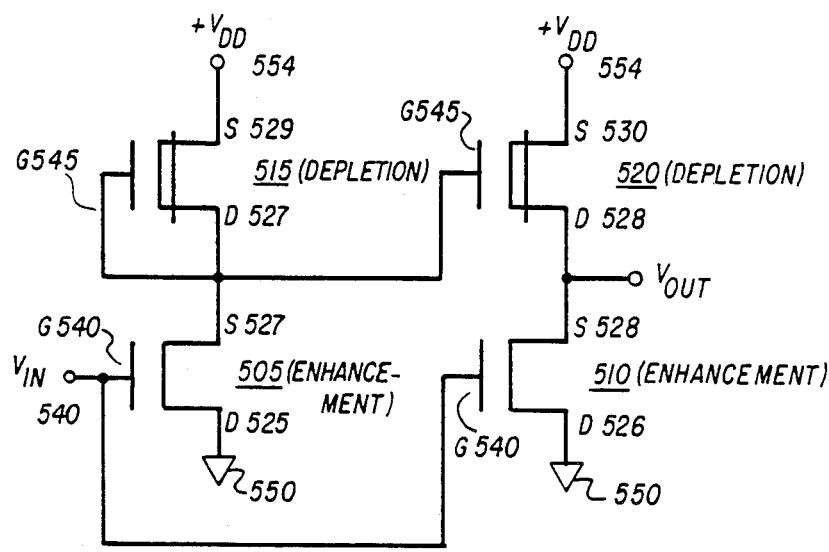
FIG. 7 is a schematic diagram of the embodiment illustrated in FIG. 6.
Figure 6:
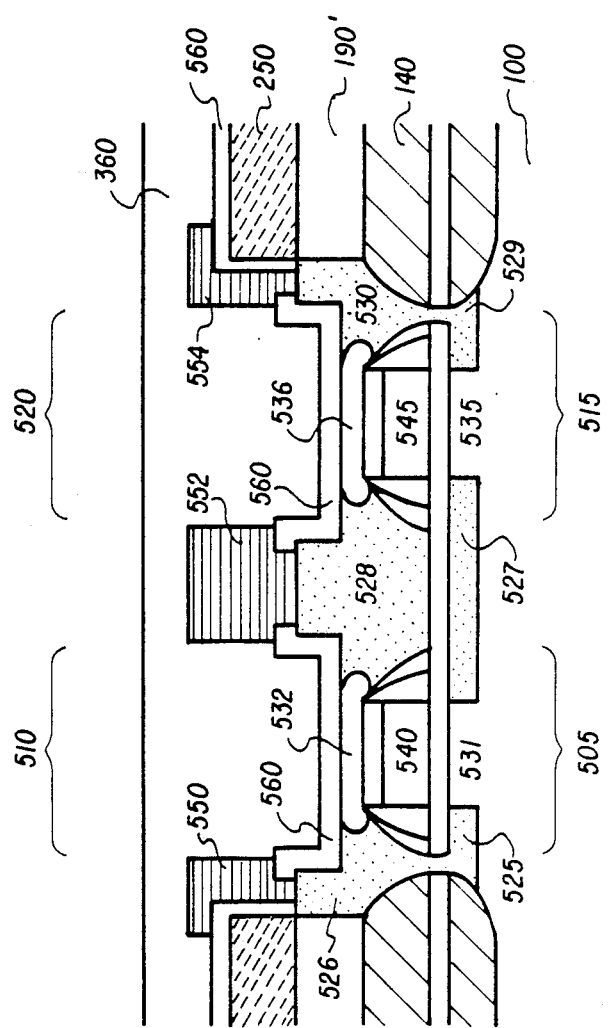
FIG. 6 illustrates a fourth embodiment of a self-aligned vertically built MOS structure and method according to the present invention.

FIG. 6 shows a fourth embodiment of the present invention. The steps in FIG. 6 are nearly the same as in FIGS. 4 and 5, with the addition that four transistors 505, 510, 515, and 520 are formed at one time between the regions of first field oxidation 140 and oxidized poly 190' and all of the source and drain regions 525–530 are formed from the same type dopant (e.g., n+ type material) which is opposite in polarity to the doping of the substrate 100. The channel regions 531 and 532 associated with transistors 505 and 510 are doped to produce enhancement mode transistors (e.g., p— doping), while channel regions 535 and 536 associated with transistors 515 and 520 are implanted (e.g., n type) to produce depletion mode transistors. Polysilicon gate 540 (e.g., n+ material) is thus a common gate for enhancement mode transistors 505 and 510, while polysilicon gate 545 (e.g., n+ material) is a common gate for depletion mode transistors 515 and 520. Region 527 and polysilicon gate 545 are connected together electrically by a metal deposition (not shown) and metal contacts 550, 552, and 554 are isolated as before by oxidation layers 250 and 560 and covered by passivation layer 360. The result is a vertically stacked gate N-MOS inverter as shown schematically in FIG. 7.

I claim:

1. A method for producing a semiconductor structure on a substrate having doping of a first type, comprising the steps of:
    forming a first intermediate insulating layer over a portion of the surface of a semiconductor substrate;
    forming a second layer of a first semiconductor material having doping of a second type over selected portions of said first intermediate insulating layer;
    forming first and second implant regions of dopant of the second type in selected regions of the substrate other than regions overlain by said second layer;
    forming a third layer of a second intermediate insulating material containing dopant of a first type at least over lateral surfaces of said second layer;
    forming a fourth layer of said first intermediate insulating layer over a selected portion of said second layer of semiconductor material;
    forming a fifth layer of semiconductor material having doping of the second type over said first, third and fourth intermediate insulating layers;
    diffusing dopant of the first type from said third layer of second intermediate insulating layer to a selected boundary limit in said fifth layer;
    depositing dopant of the first type in selected regions of said fifth layer to within a selected lateral distance from said selected boundary limit of said second layer; and
    diffusing said dopant of the first type deposited in selected regions of said fifth layer until said first type dopant material meets said selected boundary limit in said fifth layer.

2. A method as in claim 1 further comprising the steps of:
    depositing a first conductive material in selected active regions of said semiconductor substrate;
    covering selected masked regions of said first intermediate insulating layer with a first mask;
    removing said first intermediate insulating layer not covered by said first mask over at least one of said active regions to form a first opening through said first intermediate insulating layer, thereby exposing said semiconductor substrate surface;
    removing said first mask; and
    forming a second conductive material in said first opening through said first intermediate insulating layer.

3. A method as in claim 2 further comprising the steps of:
    forming a third intermediate insulating layer on the surface of said second conductive material;
    covering selectively a region of said second conductive material with a second mask;
    removing said third intermediate insulating layer not covered by said second mask to form a second opening through said third intermediatensulating layer;
    removing said second mask; and
    forming a third conductive material in said second opening.

4. A method as in claim 3 wherein said fourth conductive material comprises a metal.

5. A method for producing a semiconductor device on a substrate having doping of a first type, comprising:
    forming a first intermediate insulating layer over a portion of the surface of a semiconductor substrate;
    depositing a first depletion implant of dopant of the second type in the substrate under selected regions of said first intermediate insulating layer;
    forming a second layer of a semiconductor material having doping of a second type over said first depletion implant and .e other selected portions of said first intermediate insulating layer;
    forming a plurality of implant regions of dopant of the second type in selected regions of the substrate other than regions overlain by said second layer;
    forming a third layer of a second intermediate insulating material containing dopant of the second type at least over lateral surfaces of second layer;
    forming a fourth layer of said first intermediate insulating layer over a selected portion of said second layer of semiconductor material;
    forming a fifth layer of semiconductor material having doping of the first type over said first, third and fourth intermediate insulating layers;
    diffusing dopant of the second type from said third layer of second intermediate insulating layer to a selected boundary limit in said fifth layer;
    depositing a second depletion implant of dopant of the second type in a portion of said fifth layer;
    depositing dopant of the second type in selected regions of said fifth layer to within a selected lateral distance from said selected boundary limit of said second layer; and
    diffusing said dopant of the second type deposited in selected regions of said fifth layer until said second type dopant material meets said selected boundary limit in said fifth layer.

* * * * *

UNITED STATES PATENT AND TRADEMARK OFFICE
CERTIFICATE OF CORRECTION

PATENT NO. : 4,488,348

DATED : December 18, 1984

INVENTOR(S) : Richard D. Jolly

It is certified that error appears in the above—identified patent and that said Letters Patent is hereby corrected as shown below:

Column 6, line 12, "intermediatensulating" should read -- intermediate insulating --.

Column 6, line 28, delete ".e".

Signed and Sealed this

Twenty-first Day of May 1985

[SEAL]

Attest:

DONALD J. QUIGG

Attesting Officer    Acting Commissioner of Patents and Trademarks